United States Patent [19]

Suzuki

[11] Patent Number: 5,310,695
[45] Date of Patent: May 10, 1994

[54] INTERCONNECT STRUCTURE IN SEMICONDUCTOR DEVICE AND METHOD FOR MAKING THE SAME

[75] Inventor: Yasuyuki Suzuki, Tokyo

[73] Assignee: NEC Corporation, Tokyo, Japan

[21] Appl. No.: 946,659

[22] Filed: Sep. 18, 1992

[30] Foreign Application Priority Data

Sep. 19, 1991 [JP] Japan .................. 3-238486

[51] Int. Cl.⁵ ............................................. H01L 21/70
[52] U.S. Cl. .................................. 437/60; 437/59; 437/189; 437/192; 437/200
[58] Field of Search ............ 437/60, 192, 59, 189, 437/200

[56] References Cited

U.S. PATENT DOCUMENTS

| | | | |
|---|---|---|---|
| 4,880,708 | 11/1989 | Sharma et al. | 437/192 |
| 4,900,257 | 2/1990 | Maeda | 437/192 |
| 4,923,827 | 5/1990 | Calviello et al. | 437/192 |
| 4,963,512 | 10/1990 | Iwanaga et al. | 437/192 |
| 5,055,423 | 10/1991 | Smith et al. | 437/192 |
| 5,057,454 | 10/1991 | Yoshida et al. | 437/192 |
| 5,093,274 | 3/1992 | Kohno | 437/192 |

Primary Examiner—Brian E. Hearn
Assistant Examiner—Kevin M. Picardat
Attorney, Agent, or Firm—Burns, Doane, Swecker & Mathis

[57] ABSTRACT

An interconnect structure in a semiconductor device has a metal layer of an Au type formed at a contact hole region on an electrode or a resistor element containing tungsten (W) and an interconnect connected with the electrode or the resistor element through the metal layer. Since the metal layer of a compound such as Au which has selectivity in terms of etching rate is formed as an etching-stop layer in the contact hole region of such as WSiN or WSi which has no etching selectivity with respect to an interlayer insulating film of $SiO_2$, it is possible to form contact holes on the resistor elements of WSiN or the electrodes of WSi simultaneously with those on other electrodes containing Au and to prevent the resistor elements of WSiN or the electrodes of WSi from being etched through.

2 Claims, 4 Drawing Sheets

INTERCONNECT STRUCTURE IN SEMICONDUCTOR DEVICE AND METHOD FOR MAKING THE SAME

BACKGROUND OF THE INVENTION (1) Field of the Invention

The present invention relates to interconnect structures in a semiconductor device and a method for making the same, and more particularly to interconnect structures on electrodes or resistor elements of a semiconductor device formed by a compound semiconductor of gallium arsenide (GaAs) and a method for making such interconnect structures.

(2) Description of the Related Art

Conventionally, an N-type semiconductor layer with ionic impurities being implanted is used as resistor elements of a semiconductor integrated circuit device constituted by a semiconductor of compounds such as GaAs. However, the N-type semiconductor layer has problems in its linearity as a resistor element and stability for high frequencies. Thus, in order to replace this, a thin film such as that of tungsten silicon nitride (WSiN) is used as a resistor element. Also, for the gate electrode of a field effect transistor of GaAs, the tungsten silicon (WSi) which has a high heat resistance is generally used.

The conventional steps of forming interconnects on a thin film resistor element and electrodes are explained with reference to FIGS. 1A through 1D showing the process steps involved.

First, as shown in FIG. 1A, a film of silicon dioxide $SiO_2$ which is a protective film 5 is deposited over an entire surface of a substrate wherein an active layer 1 and electrodes 2 and 3 are formed. Next, as shown in FIG. 1B, on the resultant surface, a film of tungsten silicon nitride (WSiN) is deposited by a sputtering process and a resistor element 6 is then formed by a patterning and a dry etching process. Then, as shown in FIG. 1C, a film of $SiO_2$ is again deposited and flattened and, thereafter, contact holes 7a, 7b are opened on each of the electrodes 2, 3 and the resistor element 6, respectively, by selectively removing the $SiO_2$ on the respective contact regions. Finally, as shown in FIG. 1D, the interconnects 9 are formed through the contact holes 7a, 7b by using Ti/Pt/Au and Au metal plating.

In the above described conventional technique of forming interconnects on a resistor element of WSiN, the contact hole is formed by a dry etching process using usually a $CF_4$ gas. However, as can be appreciated from the graph of FIG. 2 which shows etching rates for dry etching performed using $CF_4$ gas with respect to various metals, no problem will be caused by any slight over-etching when a contact hole is to be formed on an electrode of Au. However, in the case where a contact hole is to be formed on resistor elements or electrodes of WSiN or WSi, there will be an over-etching problem since there is only small difference in the etching rate between the $SiO_2$ and the WSiN or WSi. Further, in the conventional interconnect structure described above, since the level of electrodes 2, 3 of WSi is below that of the resistor element 6 of WSiN, if the contact holes on both of them are formed simultaneously, the resistor element of WSiN will be etched through by the over-etching. These are problems to be solved by the present invention, in the conventional technique for forming interconnects in the semiconductor device.

SUMMARY OF THE INVENTION

It is, therefore, an object of the invention to overcome the problems in the conventional interconnect structure of a semiconductor device and method of making the same, and to provide an improved interconnect structure and a method of making the same.

According to one aspect of the invention, there is provided an interconnect structure in a semiconductor device comprising:

an electrode or resistor element containing tungsten (W);

a metal layer of an Au type formed at a contact hole region on the electrode or resistor element; and an interconnect wiring connected with the electrode or resistor element through the metal layer.

According to another object of the invention, there is also provided a method of fabricating an interconnect structure in a semiconductor device comprising the steps of:

forming an electrode or resistor element containing tungsten over a substrate;

forming a metal layer of an Au type at a contact hole region on the electrode or resistor element;

depositing an interlayer insulating film over a surface resulted from the above steps;

forming a contact hole in the interlayer insulating film on the metal layer; and forming an interconnect connected with the electrode or resistor element through the metal layer at the contact hole.

According to the present invention, in the contact hole region on the resistor element or electrode of WSiN or WSi which has no etching-selectivity with respect to $SiO_2$, a metal layer of a compound such as Au which has an excellent etching-selectivity with respect to $SiO_2$ is formed as an etching-stop layer. As a result, it is possible to form contact holes on the resistor elements or the electrodes of WSiN or WSi simultaneously with those on other electrodes of Au and to prevent the resistor elements or the electrodes of WSiN or WSi from being etched through.

BRIEF DESCRIPTION OF THE DRAWINGS

The above and other objects, features and advantages of the present invention will be apparent from the following description of a preferred embodiment of the invention explained with reference to the accompanying drawings, in which.

DESCRIPTION OF THE PREFERRED EMBODIMENT

Figure 1A:
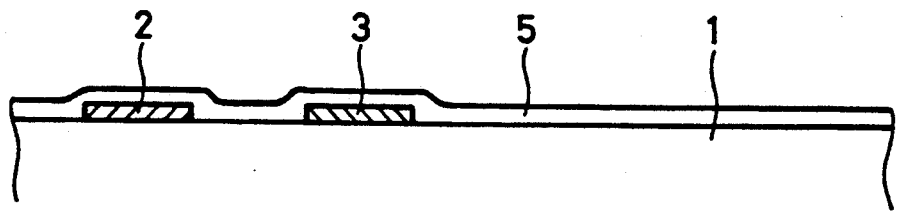
FIGS. 1A through 1D are sectional views of a conventional interconnect structure in a semiconductor device, for the explanation of the sequential process steps involved.
Figure 1B:
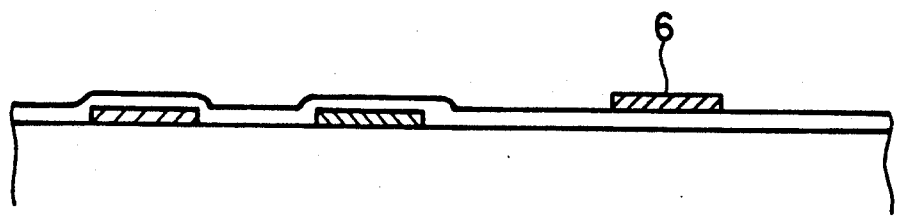
Figure 1C:
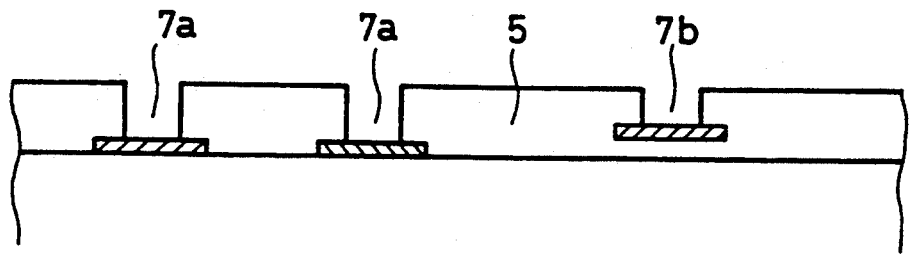
Figure 1D:
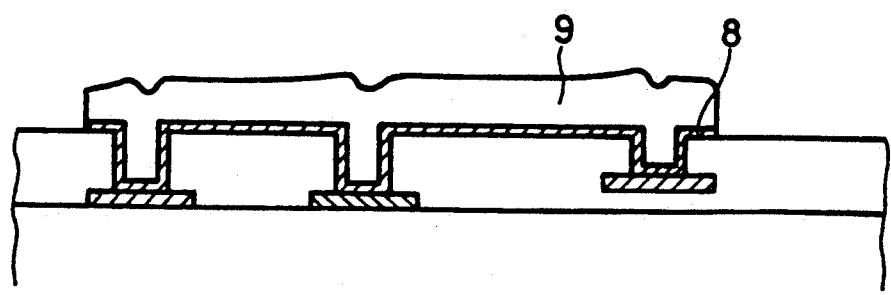
Figure 2:
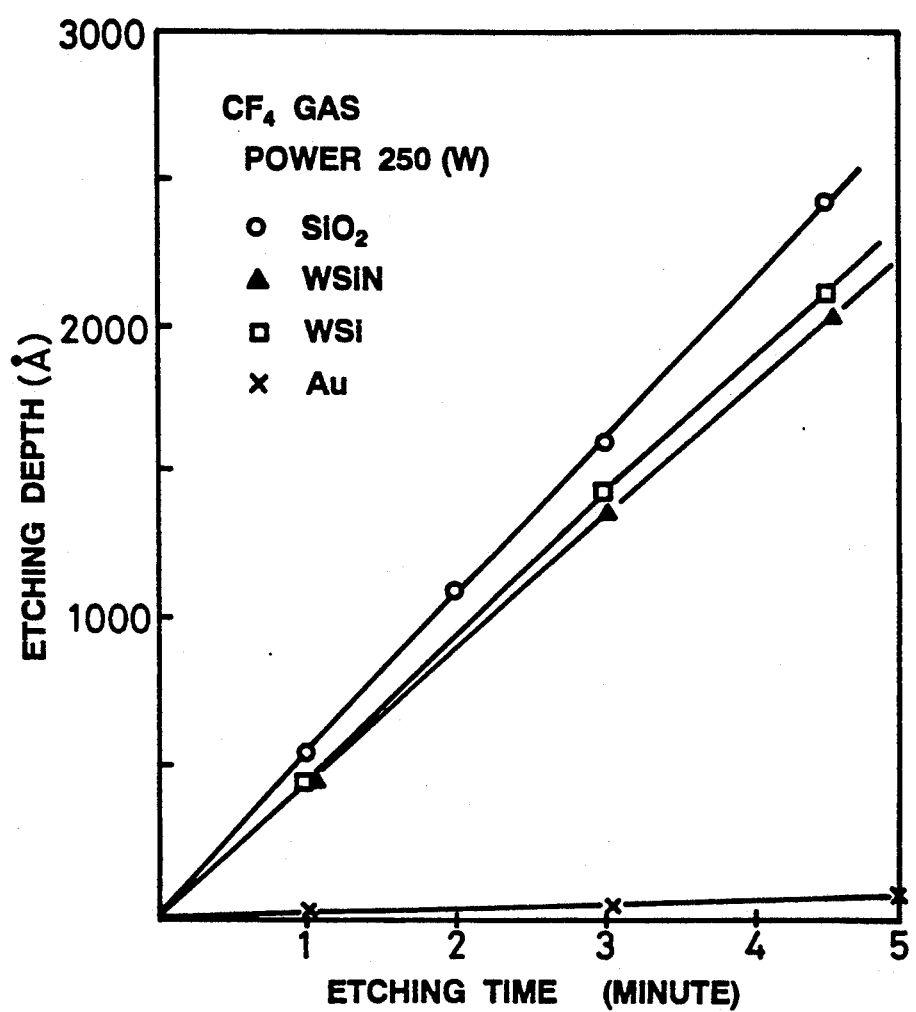
FIG. 2 is a graph showing the relation between the etching time and the etching depth in the etching by $CF_4$ gases, for the explanation of an operation of the present invention.

Now, an embodiment according to the present invention will be described with reference to the accompanying drawings. It is to be noted that, throughout the following explanation, the same or similar reference numerals refer to the same or like elements in all the figures of the drawings.

FIGS. 3A through 3G are sectional views showing an interconnect structure of a semiconductor device, for describing the sequential steps of fabricating the device according to the present invention.

Figure 3A:
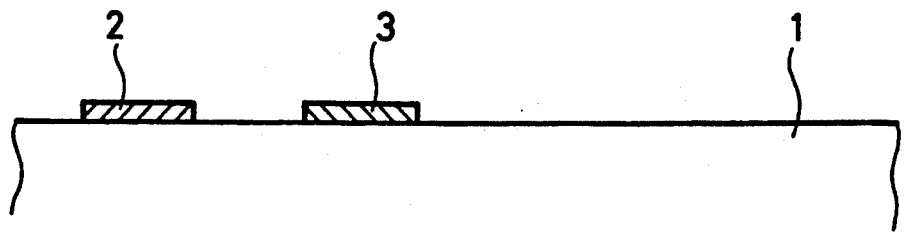
FIGS. 3A through 3G are sectional views of an interconnect structure in a semiconductor device, for the explanation of the sequential process steps involved according to the present invention.
Figure 3B:
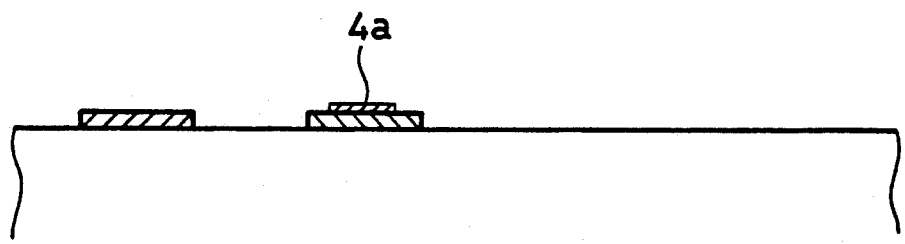
Figure 3C:
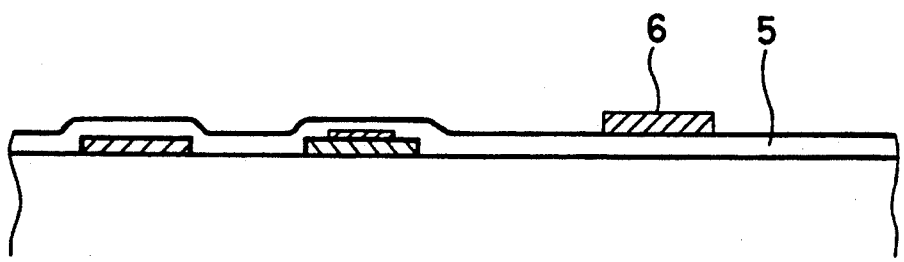
Figure 3D:
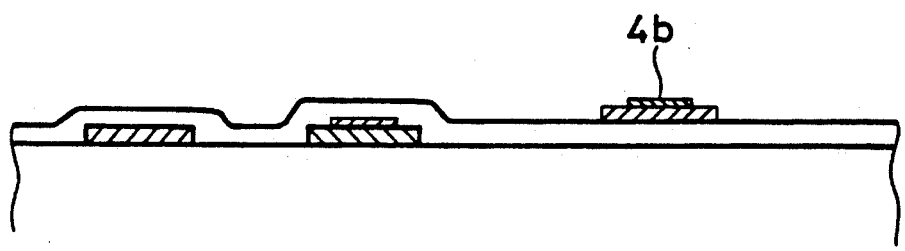
Figure 3E:
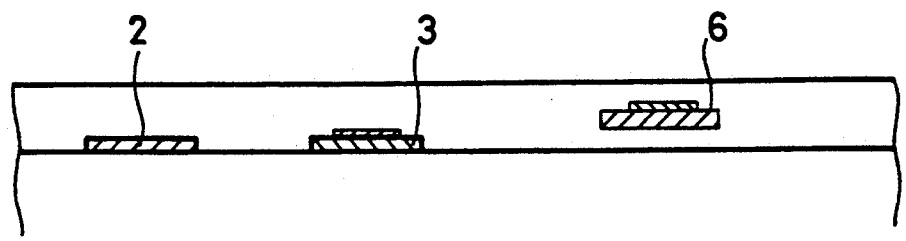
Figure 3F:
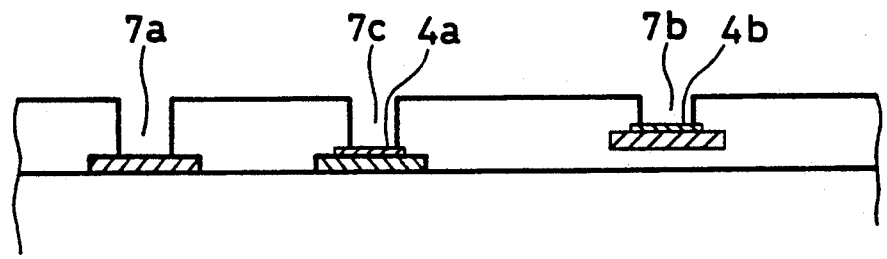
Figure 3G:
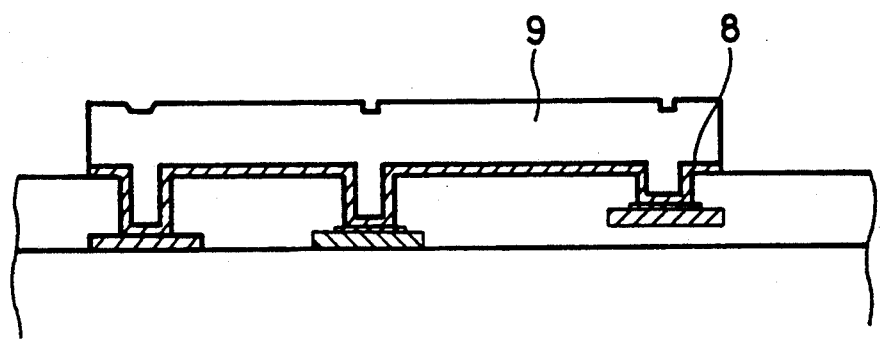

First, as shown in FIG. 3A, on an active layer 1 of GaAs, a source/drain electrode 2 of AuGe/Ni/Au and a gate electrode 3 of WSi are formed. Next, as shown in FIG. 3B, at a contact hole region on the WSi gate electrode 3, a film 4a of Ti/Pt/Au is formed by a vacuum evaporation method. Then, a film 5 of $SiO_2$ as a protective film is formed over the entire surface of a substrate and, thereafter, a film of WSiN is formed over the entire resultant surface by the sputtering process. Next, as shown in FIG. 3C, the WSiN film thus formed is subjected to the patterning using a photoresist and is dry-etched by use of an $SF_6$ gas, thereby forming a resistor element 6 of WSiN. Then, as shown in FIG. 3D, only at a contact hole region on the resistor elements 6 of WSiN, a film 4b of Ti/Au is formed by the vacuum evaporation method. Thereafter, as shown in FIG. 3E, a film 5 of $SiO_2$ is again deposited, and photoresist and an etching-back process are applied thereto, with $SiO_2$ being deposited and flattened thereby forming a flattened layer. Thereafter, as shown in FIG. 3F, all the contact holes 7a, 7c on the source/drain electrode 2 and the gate electrode 3 and the contact hole 7b on the resistor element 6 of WSiN are simultaneously formed by the dry-etching using a $CF_4$ gas. Then, as interconnects, a layer 8 of Ti/Pt/Au is first formed over the entire surface of the substrate by the sputtering and evaporation method and, thereafter, patterning of an interconnect region is performed by use of a photoresist. Then, gold-plating is performed on the Ti/Pt/Au layer 8 with this Ti/Pt/Au layer 8 being used as one electrode for plating. Thereafter, the photoresist is removed and the layer of Ti/Pt/Au in areas other than the interconnect region is removed by milling. Thus, an Au plated interconnect 9 is completed as shown in FIG. 3C.

During the formation of the contact holes 7c, 7b on the gate electrode 3 of WSi or the resistor element 6 of WSiN, the layers 4a, 4b of Au serve as dry-etching stop layers. So, even when an over-etching takes place, the layers of WSi or WSi are not etched due to the dry-etching stop layers and, thus, it is possible to form the contact holes for the electrodes and the contact holes for the resistor elements all at once.

As explained above, according to the present invention, where contact holes are formed on electrodes or resistor elements, there is no etching-through of the electrodes of the resistor elements which is caused by over-etching, even when the materials used for the electrodes or the resistor elements do not have an enough dry-etching selectivity with respect to interlayer insulating films. This provides highly satisfactory interconnects free from variations in resistance values for the resistor elements. Further, it is an advantage that all the contact holes for the respective electrodes and the resistor elements can be formed at the same time.

While the invention has been described in its preferred embodiments, it is to be understood that the words which have been used are words of description rather than limitation and that changes within the purview of the appended claims may be made without departing from the true scope and spirit of the invention in its broader aspects

What is claimed is:

1. A method of fabricating an interconnect structure in a semiconductor device comprising the steps of:
    forming an electrode or resistor element containing tungsten (W) over a substrate;
    forming a metal layer of an Au type at a contact hole region on said electrode or resistor element;
    depositing an interlayer insulating film over a surface resulting from the above steps;
    forming a contact hole in said interlayer insulating film on said metal layer; and
    forming an interconnect wirings connected with said electrode or resistor element through said metal layer at said contact hole.

2. A method of fabricating an interconnect structure in a semiconductor device comprising the steps of:
    forming, on an active layer of GaAs, a source/drain electrode of AuGe/Ni/Au and a gate electrode of WSi;
    forming, in a contact hole region on the gate electrode of WSi, a film of Ti/Pt/Au by a vacuum evaporation method;
    forming a film of $SiO_2$ as a protective film over a substrate and also a film of WSiN over the substrate by a sputtering method;
    forming on said film of $SiO_2$ a resistor element of WSiN by a patterning using a photoresist and a dry-etching using an $SF_6$ gas;
    forming, only in the contact hole region of the resistor element of WSiN, a film of Ti/Au by the vacuum evaporation method;
    depositing again, on the resulting surface, a film of $SiO_2$ followed by a photoresist coating and etch-back process, with $SiO_2$ being deposited and flattened thereby forming a flattened layer;
    forming, in said flattened layer, a contact hole on each of the source/drain electrode and the gate electrode and a contact hole on the resistor element of WSiN all at the same time by the dry-etching using a $CF_4$ gas;
    forming, as an interconnect, a layer of Ti/Pt/Au over the entire surface of the substrate by the sputtering and vapor deposition method, and patterning an interconnect region by using a photoresist;
    gold-plating to said layer of Ti/Pt/Au with this layer being used as one electrode of plating; and
    removing the photoresist and removing the layer of Ti/Pt/Au in areas other than the interconnect region by milling for an Au plated interconnect.

* * * * *